(12) United States Patent
Venkataraman et al.

(10) Patent No.: US 7,948,410 B2
(45) Date of Patent: May 24, 2011

(54) MULTIBIT RECYCLIC PIPELINED ADC ARCHITECTURE

(75) Inventors: Jagannathan Venkataraman, Bangalore (IN); Visvesvaraya A. Pentakota, Bangalore (IN); Sandeep K. Oswal, Pune (IN); Samarth S. Modi, Bangalore (IN); Shagun Dusad, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/639,705

(22) Filed: Dec. 16, 2009

(65) Prior Publication Data

US 2011/0012764 A1    Jan. 20, 2011

(30) Foreign Application Priority Data

Jul. 20, 2009 (IN) .......................... 1718/CHE/2009

(51) Int. Cl.
*H03M 1/00* (2006.01)
(52) U.S. Cl. ........ 341/122; 341/118; 341/120; 341/155; 341/161; 341/172
(58) Field of Classification Search .......... 341/118–122, 341/155, 161, 162, 172
See application file for complete search history.

(56) References Cited

U.S. PATENT DOCUMENTS

| | | | | |
|---|---|---|---|---|
| 6,078,276 A | * | 6/2000 | Signell et al. | 341/146 |
| 6,124,818 A | * | 9/2000 | Thomas et al. | 341/155 |
| 6,184,809 B1 | | 2/2001 | Yu | |
| 6,195,032 B1 | | 2/2001 | Watson et al. | |
| 6,977,604 B2 | | 12/2005 | Wada et al. | |
| 7,002,507 B2 | * | 2/2006 | Kobayashi et al. | 341/162 |
| 7,084,803 B2 | | 8/2006 | Kobayashi et al. | |
| 7,088,277 B2 | * | 8/2006 | Kobayashi et al. | 341/155 |

(Continued)

FOREIGN PATENT DOCUMENTS

WO    WO0195494    12/2001

OTHER PUBLICATIONS

"Designing 1MHz to 5MHz Conversion Rate ADCs," Electronics Engineer May 1999, pp. 1-6 (Sumeet Mathur and C. Srinivasan).

(Continued)

*Primary Examiner* — Linh V Nguyen
(74) *Attorney, Agent, or Firm* — John J. Patti; Wade J. Brady, III; Frederick J. Telecky, Jr.

(57) ABSTRACT

An apparatus is provided. The apparatus comprises a sample switch, a sampling capacitor, an amplifier, feedback branches, a second hold switch, an N-bit converter pair, a third hold switch, and an M-bit converter pair. The sample receives an input signal and is actuated by a sample signal. The sampling capacitor is coupled to the sample switch. The amplifier has a first input terminal that is coupled to the sampling capacitor. The feedback branches are coupled between the output terminal of the amplifier and the first input terminal of the amplifier, with each feedback branch including a feedback capacitor, and a first hold switch that is coupled to the feedback capacitor. The second hold switch is coupled to the sampling switch. The N-bit converter pair is coupled to the sampling switch and to the second hold switch. The third hold switch is coupled to at least one of the feedback branches, and the M-bit converter pair is coupled to the output terminal of the amplifier and to the third hold switch.

18 Claims, 1 Drawing Sheet

U.S. PATENT DOCUMENTS

| | | | |
|---|---|---|---|
| 7,091,897 B2 * | 8/2006 | Kobayashi | 341/161 |
| 7,095,352 B2 | 8/2006 | Tani et al. | |
| 7,119,729 B2 | 10/2006 | Wada et al. | |
| 7,126,523 B2 * | 10/2006 | Tadeparthy | 341/162 |
| 7,173,556 B2 | 2/2007 | Kobayashi et al. | |
| 7,187,311 B2 * | 3/2007 | Wada et al. | 341/161 |
| 7,265,705 B1 * | 9/2007 | Lee et al. | 341/162 |
| 7,289,055 B2 * | 10/2007 | Kobayashi et al. | 341/161 |
| 7,385,536 B2 * | 6/2008 | Kinyua et al. | 341/122 |
| 2010/0176977 A1 * | 7/2010 | Ranganathan et al. | 341/122 |
| 2010/0182176 A1 * | 7/2010 | Kawahito | 341/122 |

OTHER PUBLICATIONS

Datasheet for Texas Instruments Incorporated, TLV1562, Sep. 1998.

* cited by examiner

MULTIBIT RECYCLIC PIPELINED ADC ARCHITECTURE

CROSS-REFERENCE TO RELATED APPLICATIONS

This patent application claims priority from India Provisional Application No. 1718/CHE/2009, filed 20 Jul. 2009, the entirety of which is incorporated herein by reference.

TECHNICAL FIELD

The invention relates generally to an analog-to-digital converter (ADC) and, more particularly, to a recyclic pipeline architecture for an ADC.

BACKGROUND

Pipelined analog-to-digital converters (ADCs) are commonly used for data conversions at high frequencies. These pipelines often include several stages that each resolve a certain number of bits. Generally, a larger number of bits is resolved by the first stage of a pipeline, allowing for fewer stages to be employed. This is generally desirable because the reduction of the total number of stages usually reduces power consumption and usually improves the Spurious-Free Dynamic Range (SFDR). Flash/comparator and amplifier offset, though, usually limit the number of bits that the first stage can resolve, which ultimately results in a limited closed loop residue gain that affects the noise contribution of the first stage and the following stages.

Some examples of conventional designs are: U.S. Pat. Nos. 6,184,809; 6,195,032; 6,977,604; 7,002,507; 7,084,803; 7,095,352; 7,119,729; 7,173,556; 7,187,311; 7,289,055; PCT Publ. No. WO2001095494; Mathur et al., "Designing 1 MHz to 5 MHz conversion rate ADCs," *Electronics Engineer*, May 1999; and Datasheet for Texas Instruments Incorporated's TLV1562 dated September 1998.

SUMMARY

A preferred embodiment of the present invention, accordingly, provides an apparatus. The apparatus comprises a sample switch that receives an input signal, wherein the sample switch is actuated by a sample signal; a sampling capacitor that is coupled to the sample switch; an amplifier having a first input terminal, a second input terminal, and an output terminal, wherein the first input terminal of the amplifier is coupled to the sampling capacitor; a plurality of feedback branches coupled between the output terminal of the amplifier and the first input terminal of the amplifier, wherein each feedback branch includes: a feedback capacitor; and a first hold switch that is coupled to the feedback capacitor; a second hold switch that is coupled to the sampling switch; a N-bit converter pair that is coupled to the sampling switch and to the second hold switch; a third hold switch that is coupled to at least one of the feedback branches; and an M-bit converter pair that is coupled to the output terminal of the amplifier and to the third hold switch.

In accordance with a preferred embodiment of the present invention, the N-bit converter pair further comprises an N-bit analog-to-digital converter (ADC) that is coupled to the sample switch; and an N-bit digital-to-analog converter (DAC) that is coupled to the N-bit ADC and to the second hold switch.

In accordance with a preferred embodiment of the present invention, the M-bit converter further comprises: an M-bit ADC that is coupled to the output terminal of the amplifier; and an M-bit DAC that is coupled to the M-bit ADC and to the third hold switch.

In accordance with a preferred embodiment of the present invention, at least one of the feedback capacitors has a first capacitance.

In accordance with a preferred embodiment of the present invention, the sample capacitor has a capacitance of $2^{N-1}$ times the first capacitance.

In accordance with a preferred embodiment of the present invention, at least one of the feedback capacitors has a capacitance of $2^{M-1}$ times the first capacitance.

In accordance with a preferred embodiment of the present invention, an apparatus is provided. The apparatus comprises a sample switch that receives an input signal, wherein the sample switch is actuated by a sample signal; a first capacitor that is coupled to the sample switch; a first hold switch that is coupled to the first capacitor, wherein the first hold switch is actuated by at least one of a first hold signal and a second hold signal; an N-bit DAC that is coupled to the first hold switch; an amplifier having a first input terminal, a second input terminal, and an output terminal, wherein the first input terminal of the amplifier is coupled to the first capacitor; a second capacitor that is coupled to the first input terminal of the amplifier; a second hold switch that is coupled between the second capacitor and the output terminal of the amplifier, wherein the second hold switch is actuated by at least one of the first hold signal and the second hold signal; a third capacitor that is coupled to first input terminal of the amplifier; a third hold switch that is coupled between the third capacitor and the output terminal of the amplifier, wherein the third hold switch is actuated by the first hold signal; a fourth hold switch that is coupled to the third capacitor and the third hold switch, wherein the fourth hold switch is actuated by the second hold signal; and an M-bit DAC that is coupled to the fourth hold switch.

In accordance with a preferred embodiment of the present invention, the apparatus further comprises an ADC that receives input signal and that is coupled to the first DAC.

In accordance with a preferred embodiment of the present invention, the apparatus further comprises an ADC that is coupled between the output terminal of the amplifier and the second DAC.

In accordance with a preferred embodiment of the present invention, an ADC is provided. The ADC comprises a pipeline having a plurality of stages that are coupled to one another in sequence, wherein each stage includes: a sample switch that receives an input signal, wherein the sample switch is actuated by a sample signal; a first capacitor that is coupled to the sample switch; a first hold switch that is coupled to the first capacitor, wherein the first hold switch is actuated by at least one of a first hold signal and a second hold signal; an N-bit digital-to-analog converter (DAC) that is coupled to the first hold switch; an amplifier having a first input terminal, a second input terminal, and an output terminal, wherein the first input terminal of the amplifier is coupled to the first capacitor; a second capacitor that is coupled to the first input terminal of the amplifier; a second hold switch that is coupled between the second capacitor and the output terminal of the amplifier, wherein the second hold switch is actuated by at least one of the first hold signal and the second hold signal; a third capacitor that is coupled to first input terminal of the amplifier; a third hold switch that is coupled between the third capacitor and the output terminal of the amplifier, wherein the third hold switch is actuated by the first hold signal; a fourth hold switch that is coupled to the third capacitor and the third hold switch, wherein the fourth hold switch is actuated by the second hold signal; and an M-bit DAC that is coupled to the fourth hold switch; and a digital correction circuit that is coupled to each of the plurality of stages.

In accordance with a preferred embodiment of the present invention, the each stage further comprises a flash ADC that receives input signal and that is coupled to the first DAC.

In accordance with a preferred embodiment of the present invention, the each stage further comprises an ADC that is coupled between the output terminal of the amplifier and the second DAC.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
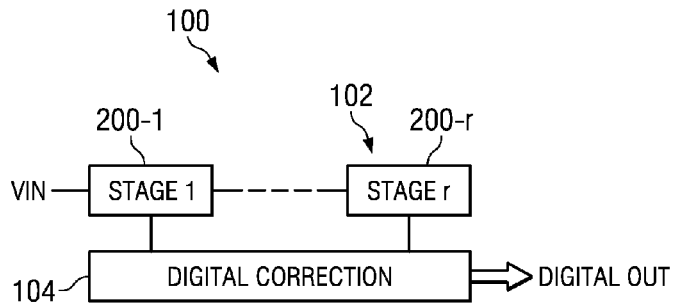
FIG. 1 is a block diagram of an example of analog-to-digital converter (ADC) in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates an example of an analog-to-digital converter (ADC) in accordance with a preferred embodiment of the present invention. ADC 100 generally comprises a pipeline 102 that receives an analog input signal VIN and a digital correction circuit 104 which output a digital signal DIGITAL_OUT. The pipeline 102 has a number of stages 200-1 to 200-$r$ arranged in a sequence and coupled to one another and to the digital correction circuit 104.

Figure 2:
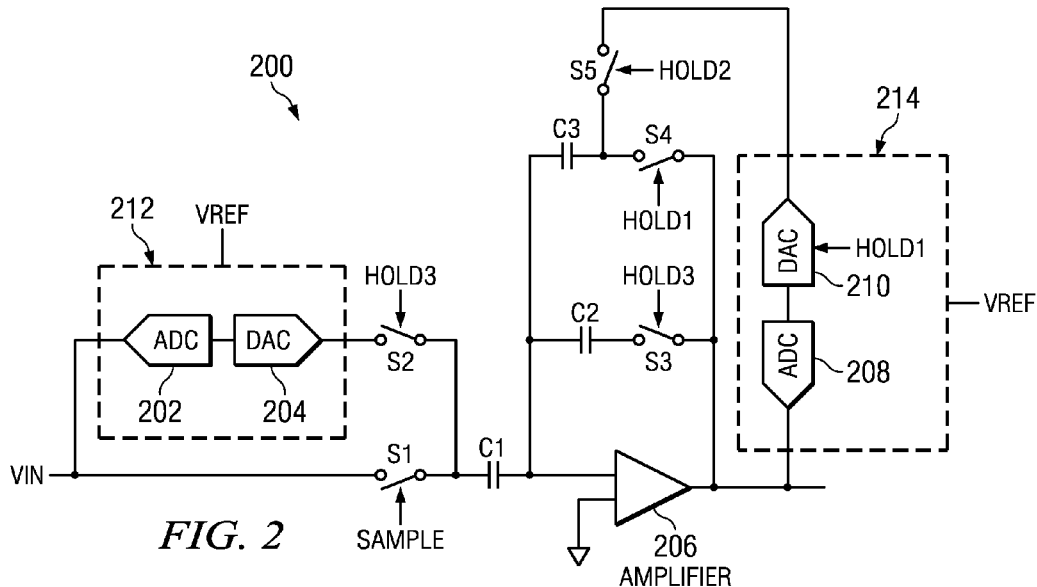
FIG. 2 is a circuit diagram of an example of a stage of the ADC pipeline of FIG. 1.
Figure 3:
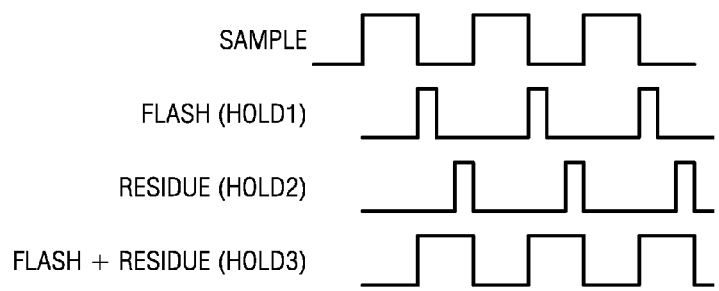
FIG. 3 is an example of a timing diagram of the sample and hold signals for the ADC of FIG. 1.

Turning to FIGS. 2 and 3, a stage 200 (which is generally representative of each of stages 200-1 to 200-$r$) can be seen in greater detail. Stage 200 generally comprises switches S1 through S5, converter pairs 212 and 214, capacitors C1 through C3, and amplifier 206. Converter pair 212 is generally comprised of an N-bit flash ADC 202 and an N-bit digital-to-analog converter (DAC), while converter pair 214 is generally comprised of M-bit flash ADC 208 and M-bit multiplying-DAC (MDAC). Moreover, capacitor C2 preferably has a capacitance C, while capacitor C1 preferably has a capacitance of $2^{N-1}$ C and capacitor C3 preferably has a capacitance of $2^{m-1}$ C. Additionally, each of the converter pairs 212 and 214 receives a reference voltage VREF.

As can be seen in FIG. 3, operation of the stage 200 begins with the sample signal SAMPLE transitioning from logic low to logic high. At logic high, the sample signal SAMPLE actuates sample switch S1, so that the analog input signal VIN can be sampled by capacitor C1. At the same time, the first N bits of the analog input signal VIN are converted by the converter pair 212, which corresponds to a flash value. The sample signal SAMPLE then transitions back to logic low, deactuating switch S1.

Following the deactuation of switch S1, the stage 200 enters a flash phase. During the flash phase, a flash or hold signal HOLD1 transitions to logic high. When the flash signal HOLD1 is logic high, the hold switches S2, S3, and S5 are actuated. The actuation of switch S3 allows the DAC output corresponding to the ADC value from converter pair 212 to be applied to capacitor C1, and the actuation of switches S3 and S4 allows for the branches that include feedback capacitors C2 and C3 to form parallel feedback paths between the output terminal of amplifier 206 and one of the input terminals of the amplifier 206. Thus, this configuration allows amplifier 206 to have a closed loop gain of $2^{N-1}$ that can be applied to the residue, due in at least part to the relative capacitances of capacitors C1 and C2 that are applied to switch S3. During the flash phase, accuracy requirements are also very much relaxed as they need to meet the offset requirements of the ADC 208 in the converter pair 214. Additionally, the time for this phase can be small as settling accuracy is relaxed.

Upon completion of the flash phase, the flash signal HOLD1 transitions to logic low, while residue or hold signal HOLD2 transitions to logic high, to enter a residue phase. During this residue phase, switches S2 and S3 remain actuated, while switch S4 is deacutated and switch S5 is actuated. Additionally, converter pair 214 forms an additional feedback path with feedback capacitor C3; thus, the gain applied to the output residue is $2^{N+M-2}$, so that amplifier 206 operates as the residue gain stage. During the residue phase, the tighter accuracy requirements are used, as in the conventional architecture, and more time than the flash phase is used.

Since N+M bits are converted before the residue is transferred to another stage, such as stage 200-$r$, the accuracy thresholds in terms of non-idealities (i.e., capacitor mismatch) can be greatly relaxed. Additionally, the Spurious-Free Dynamic Range (SFDR) given by 9K-6 dB (where K is the combined resolution of the ADC 202 and ADC 208) is increased. Additionally, since the amplifier 206 operates as a preamplifier and as the residual gain stage, the offset of amplifier 206 does not become larger as with conventional architectures. ADC 100 also has a high signal to noise ratio, at least in part due to the high interstage gain Additionally, the noise contribution of the following stages is significantly reduced because of the high interstage gain.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a sample switch that receives an input signal, wherein the sample switch is actuated by a sample signal;
   a sampling capacitor that is coupled to the sample switch;
   an amplifier having a first input terminal, a second input terminal, and an output terminal, wherein the first input terminal of the amplifier is coupled to the sampling capacitor;
   a plurality of feedback branches coupled between the output terminal of the amplifier and the first input terminal of the amplifier, wherein each feedback branch includes:
      a feedback capacitor; and
      a first hold switch that is coupled to the feedback capacitor;
   a second hold switch that is coupled to the sampling switch;
   a N-bit converter pair that is coupled to the sampling switch and to the second hold switch;
   a third hold switch that is coupled to at least one of the feedback branches; and
   an M-bit converter pair that is coupled to the output terminal of the amplifier and to the third hold switch.

2. The apparatus of claim 1, wherein the N-bit converter pair further comprises:
   an N-bit analog-to-digital converter (ADC) that is coupled to the sample switch; and
   an N-bit digital-to-analog converter (DAC) that is coupled to the N-bit ADC and to the second hold switch.

3. The apparatus of claim 1, wherein the M-bit converter further comprises:
   an M-bit ADC that is coupled to the output terminal of the amplifier; and
   an M-bit DAC that is coupled to the M-bit ADC and to the third hold switch.

4. The apparatus of claim 1, wherein at least one of the feedback capacitors has a first capacitance.

5. The apparatus of claim 4, wherein the sample capacitor has a capacitance of $2^{N-1}$ times the first capacitance.

6. The apparatus of claim 5, wherein at least one of the feedback capacitors has a capacitance of $2^{M-1}$ times the first capacitance.

7. An apparatus comprising:
   a sample switch that receives an input signal, wherein the sample switch is actuated by a sample signal;
   a first capacitor that is coupled to the sample switch;
   a first hold switch that is coupled to the first capacitor, wherein the first hold switch is actuated by at least one of a first hold signal and a second hold signal;
   an N-bit DAC that is coupled to the first hold switch;
   an amplifier having a first input terminal, a second input terminal, and an output terminal, wherein the first input terminal of the amplifier is coupled to the first capacitor;
   a second capacitor that is coupled to the first input terminal of the amplifier;
   a second hold switch that is coupled between the second capacitor and the output terminal of the amplifier, wherein the second hold switch is actuated by at least one of the first hold signal and the second hold signal;
   a third capacitor that is coupled to first input terminal of the amplifier;
   a third hold switch that is coupled between the third capacitor and the output terminal of the amplifier, wherein the third hold switch is actuated by the first hold signal;
   a fourth hold switch that is coupled to the third capacitor and the third hold switch, wherein the fourth hold switch is actuated by the second hold signal; and
   an M-bit DAC that is coupled to the fourth hold switch.

8. The apparatus of claim 7, wherein the apparatus further comprises an ADC that receives input signal and that is coupled to the first DAC.

9. The apparatus of claim 7, wherein the apparatus further comprises an ADC that is coupled between the output terminal of the amplifier and the second DAC.

10. The apparatus of claim 7, wherein the second capacitor has a first capacitance.

11. The apparatus of claim 10, wherein the first capacitor has a capacitance of $2^{N-1}$ times the first capacitance.

12. The apparatus of claim 11, wherein the third capacitor has a capacitance of $2^{M-1}$ times the first capacitance.

13. An ADC comprising:
   a pipeline having a plurality of stages that are coupled to one another in sequence, wherein each stage includes:
      a sample switch that receives an input signal, wherein the sample switch is actuated by a sample signal;
      a first capacitor that is coupled to the sample switch;
      a first hold switch that is coupled to the first capacitor, wherein the first hold switch is actuated by at least one of a first hold signal and a second hold signal;
      an N-bit digital-to-analog converter (DAC) that is coupled to the first hold switch;
      an amplifier having a first input terminal, a second input terminal, and an output terminal, wherein the first input terminal of the amplifier is coupled to the first capacitor;
      a second capacitor that is coupled to the first input terminal of the amplifier;
      a second hold switch that is coupled between the second capacitor and the output terminal of the amplifier, wherein the second hold switch is actuated by at least one of the first hold signal and the second hold signal;
      a third capacitor that is coupled to first input terminal of the amplifier;
      a third hold switch that is coupled between the third capacitor and the output terminal of the amplifier, wherein the third hold switch is actuated by the first hold signal;
      a fourth hold switch that is coupled to the third capacitor and the third hold switch, wherein the fourth hold switch is actuated by the second hold signal; and
      an M-bit DAC that is coupled to the fourth hold switch; and
   a digital correction circuit that is coupled to each of the plurality of stages.

14. The ADC of claim 13, wherein the each stage further comprises a flash ADC that receives input signal and that is coupled to the first DAC.

15. The ADC of claim 13, wherein the each stage further comprises an ADC that is coupled between the output terminal of the amplifier and the second DAC.

16. The ADC of claim 13, wherein the second capacitor has a first capacitance.

17. The ADC of claim 16, wherein the first capacitor has a capacitance of $2^{N-1}$ times the first capacitance.

18. The ADC of claim 17, wherein the third capacitor has a capacitance of $2^{M-1}$ times the first capacitance.

* * * * *